United States Patent
Song et al.

(10) Patent No.: US 9,178,038 B2
(45) Date of Patent: Nov. 3, 2015

(54) RAISED SOURCE/DRAIN MOS TRANSISTOR AND METHOD OF FORMING THE TRANSISTOR WITH AN IMPLANT SPACER AND AN EPITAXIAL SPACER

(71) Applicant: Texas Instruments Incorporated, Dallas, TX (US)

(72) Inventors: Seung-Chul Song, San Diego, CA (US); James W. Blatchford, Richardson, TX (US); Kwan-Yong Lim, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/609,051

(22) Filed: Jan. 29, 2015

(65) Prior Publication Data
US 2015/0140769 A1    May 21, 2015

Related U.S. Application Data

(62) Division of application No. 13/729,282, filed on Dec. 28, 2012, now abandoned.

(51) Int. Cl.
| | |
|---|---|
| *H01L 21/336* | (2006.01) |
| *H01L 29/78* | (2006.01) |
| *H01L 29/66* | (2006.01) |
| *H01L 21/265* | (2006.01) |
| *H01L 29/08* | (2006.01) |
| *H01L 29/417* | (2006.01) |

(52) U.S. Cl.
CPC .......... *H01L 29/6659* (2013.01); *H01L 21/265* (2013.01); *H01L 29/0847* (2013.01); *H01L 29/41783* (2013.01); *H01L 29/6653* (2013.01); *H01L 29/6656* (2013.01); *H01L 29/66628* (2013.01); *H01L 29/7834* (2013.01)

(58) Field of Classification Search
CPC .................. H01L 21/823418; H01L 29/41783
USPC ..................... 438/300, 301, 306, 307
See application file for complete search history.

(56) References Cited

U.S. PATENT DOCUMENTS

| | | | | |
|---|---|---|---|---|
| 7,338,874 | B2 * | 3/2008 | Oh et al. | 438/300 |
| 7,488,660 | B2 * | 2/2009 | Dyer et al. | 438/300 |
| 7,611,938 | B2 * | 11/2009 | Cheng et al. | 438/199 |
| 8,003,472 | B2 * | 8/2011 | Iwasa | 438/300 |
| 8,435,848 | B2 * | 5/2013 | Mehrotra | 438/199 |
| 2006/0255413 | A1 * | 11/2006 | Oh et al. | 257/382 |
| 2007/0128786 | A1 * | 6/2007 | Cheng et al. | 438/199 |
| 2007/0194387 | A1 * | 8/2007 | Dyer et al. | 257/369 |
| 2008/0224212 | A1 * | 9/2008 | Lee et al. | 257/344 |
| 2011/0053330 | A1 * | 3/2011 | Iwasa | 438/300 |
| 2011/0124171 | A1 * | 5/2011 | Cho et al. | 438/300 |
| 2012/0108021 | A1 * | 5/2012 | Mehrotra | 438/231 |
| 2014/0183663 | A1 * | 7/2014 | Song et al. | 257/408 |

\* cited by examiner

*Primary Examiner* — Earl Taylor
(74) *Attorney, Agent, or Firm* — Jacqueline J. Garner; Frank D. Cimino

(57) ABSTRACT

A raised source/drain MOS transistor is formed in a process that utilizes a first sidewall spacer when implanting a semiconductor region to form the heavily-doped source region and the heavily-doped drain region of the transistor, and a second different sidewall spacer when epitaxially growing the raised source region and the raised drain region of the transistor.

3 Claims, 14 Drawing Sheets

RAISED SOURCE/DRAIN MOS TRANSISTOR AND METHOD OF FORMING THE TRANSISTOR WITH AN IMPLANT SPACER AND AN EPITAXIAL SPACER

CROSS REFERENCE TO RELATED APPLICATIONS

This application is a divisional of U.S. Nonprovisional patent application Ser. No. 13/729,282, filed Dec. 28, 2012, the contents of which are herein incorporated by reference in its entirety.

BACKGROUND OF THE INVENTION

1. Field of the Invention

The present invention relates to raised source/drain MOS transistors and, more particularly, to a raised source/drain MOS transistor and a method of forming the transistor with an implant spacer and an epitaxial spacer.

2. Description of the Related Art

A metal oxide semiconductor (MOS) transistor is a well-known semiconductor device which can be implemented as either an n-channel (NMOS) device or a p-channel (PMOS) device. A MOS transistor has spaced-apart source and drain regions, which are separated by a channel, and a gate that lies over, and is insulated from, the channel by a gate dielectric layer. A raised source/drain MOS transistor is a type of MOS transistor that also includes an epitaxially-grown raised source region and an epitaxially-grown raised drain region.

FIG. 1 shows a cross-sectional view that illustrates a prior-art raised source/drain MOS transistor 100. As shown in FIG. 1, MOS transistor 100 includes a semiconductor body 110. Semiconductor body 110, in turn, includes a single-crystal-silicon substrate region 112, and a trench isolation structure 114 that touches substrate region 112.

In addition, semiconductor body 110 includes a source 120 and a drain 122 that each touch substrate region 112. Source 120 includes a lightly-doped source region 120L, a heavily-doped source region 120H, and a raised source region 120E, each of which has a conductivity type that is the opposite of the conductivity type of substrate region 112.

Lightly-doped source region 120L touches substrate region 112, heavily-doped source region 120H touches both substrate region 112 and lightly-doped source region 120L, and raised source region 120E, which is heavily-doped, touches and lies above the top surface of heavily-doped source region 120H. Further, heavily-doped source region 120L has a maximum width W1 that is slightly, but insubstantially larger, than a maximum width W2 of raised source region 120E.

Similarly, drain 122 includes a lightly-doped drain region 122L, a heavily-doped drain region 122H, and a raised drain region 122E, each of which has a conductivity type that is the opposite of the conductivity type of substrate region 112. Lightly-doped drain region 122L touches substrate region 112, heavily-doped drain region 122H touches both substrate region 112 and lightly-doped drain region 122L, and raised drain region 122E touches and lies above the top surface of heavily-doped drain region 122H.

Further, heavily-doped drain region 122L has a maximum width W3 that is slightly, but insubstantially larger, than a maximum width W4 of raised drain region 122E. The source 120 and drain 122, which are spaced apart, also define a channel region 124 of substrate region 112. Channel region 124, which has the same conductivity type as substrate region 112, lies between source 120 and drain 122.

As further shown in FIG. 1, MOS transistor 100 includes a gate dielectric 126 that touches and lies over channel region 124, and a gate 130 that touches gate dielectric 126 and lies over channel region 124. MOS transistor 100 also includes a protective cap 131 that touches and lies over gate 130, and a sidewall spacer 132 that touches and laterally surrounds gate 130 and protective cap 131. Sidewall spacer 132, which is non-conductive, also touches the raised source and drain regions 120E and 122E.

The threshold voltage of a transistor is the gate voltage required to form an inversion layer at the top surface of the channel region that is sufficient to allow a current to flow from the source region to the drain region. In the case of an NMOS transistor, n-type dopant atoms form the inversion layer, while p-type dopant atoms form the inversion layer in the case of a PMOS transistor.

In operation, with respect to NMOS transistors, when a positive drain-to-source voltage $V_{DS}$ is present, and the gate-to-source voltage $V_{GS}$ is more positive than the threshold voltage, the NMOS transistor turns on and electrons flow from the source region to the drain region. When the gate-to-source voltage $V_{GS}$ is more negative than the threshold voltage, the MOS transistor turns off and no electrons (other than a very small leakage current) flow from the source region to the drain region.

With respect to PMOS transistors, when a negative drain-to-source voltage $V_{DS}$ is present, and the gate-to-source voltage $V_{GS}$ is more negative than the threshold voltage, the PMOS transistor turns on and holes flow from the source region to the drain region. When the gate-to-source voltage $V_{GS}$ is more positive than the threshold voltage, the PMOS transistor turns off and no holes (other than a very small leakage current) flow from the source region to the drain region.

One issue that becomes increasingly important as transistor sizes shrink to, for example, a 50 nm-size, is short channel effects. One approach to controlling short channel effects in conventional 50 nm-sized transistors, which do not have raised source and drain regions, is to utilize very shallow junctions. Very shallow junctions, however, increase the series resistance of the source and the drain. One technique for reducing the series resistance is to reduce the width of the sidewall spacer.

However, when the width of the sidewall spacer is meaningfully reduced, the out diffusion of dopant atoms from the heavily-doped source and drain regions during an anneal commonly consumes and eliminates the lightly-doped source and drain regions which, in turn, reduces the short channel performance.

Raised source/drain MOS transistor 100 differs from conventional 50 nm-sized transistors in that the raised source and drain regions 120E and 122E substantially reduce the number of dopant atoms from the heavily-doped source and drain regions 120H and 122H that diffuse during the anneal into the lightly-doped source and drain regions 120L and 122L that lie below sidewall spacer 132.

Thus, MOS transistor 100 improves short channel performance because a thin sidewall spacer, which improves short channel performance, is used in combination with the raised source and drain regions 120E and 122E, which limit the diffusion of dopant atoms into the lightly-doped source and drain regions 120L and 122L, and thereby prevent the lightly-doped source and drain regions 120L and 122L from being consumed.

FIGS. 2A-2F show cross-sectional views that illustrate a prior-art method 200 of forming a raised source/drain MOS transistor. As shown in FIG. 2A, method 200 utilizes a conventionally-formed semiconductor body 210 that includes a single-crystal-silicon substrate region 212 and an isolation structure 214 that touches substrate region 212. As further shown in FIG. 2, method 200 begins by forming a gate dielectric layer 216 that touches and lies over substrate region 212. Gate dielectric layer 216 can be implemented with, for example, a layer of oxide.

After gate dielectric layer 216 has been formed, a gate layer 218 is formed to touch and lie over gate dielectric layer 216. Gate layer can be implemented with, for example, a layer of polysilicon. Once gate layer 218 has been formed, a protective layer 219 is formed to touch and lie over gate layer 218. Protective layer 219 can be implemented with, for example, a layer of nitride. Following this, a patterned mask 220 is formed on protective layer 218 using conventional procedures.

As shown in FIG. 2B, after patterned mask 220 has been formed, the exposed regions of protective layer 219, underlying gate layer 218, and underlying gate dielectric layer 216 are etched away in a conventional manner to expose the top surface of substrate region 212 and form a gate structure 221.

Gate structure 221, in turn, includes a gate dielectric 222 that touches and lies above substrate region 212, a gate 224 that touches and lies above gate dielectric 222, and a protective cap 225 that touches and lies above gate 224. Following the etch, patterned mask 220 is removed in a conventional manner.

As shown in FIG. 2C, after patterned mask 220 has been removed, a dopant is implanted into substrate region 212 using conventional procedures, followed by an anneal to drive in the implant and form spaced-apart lightly-doped regions 230 and 232. The lightly-doped regions 230 and 232 have a conductivity type that is opposite to the conductivity type of substrate region 212.

As shown in FIG. 2D, after the lightly-doped regions 230 and 232 have been formed, a non-conductive side wall spacer 234 is formed in a conventional fashion to touch and laterally surround gate 224 and protective cap 225. Non-conductive side wall spacer 234 can be formed in a number of ways. For example, a layer of oxide can be deposited on gate 224, protective cap 225, lightly-doped source region 230, and lightly-doped drain region 232, followed by the anisotropic etch of the layer of oxide until the top surface of protective cap 225 has been exposed to form sidewall spacer 234.

As shown in FIG. 2E, after side wall spacer 234 has been formed, a raised source region 240 is epitaxially grown on lightly-doped source region 230, while a raised drain region 242 is epitaxially grown on lightly-doped drain region 232 at the same time. Nothing is epitaxially grown on gate 224 due to the presence of protective cap 225.

As shown in FIG. 2F, after the raised source region 240 and the raised drain region 242 have been formed, a dopant is implanted into substrate region 212 and the lightly-doped regions 230 and 232 to form spaced-apart heavily-doped source and drain regions 244 and 246. Raised source region 240 and raised drain region 242 are also doped during the implant.

Following the implant raised source region 240 and heavily-doped source region 244 have substantially equal maximum widths. Similarly, after the implant raised drain region 242 and heavily-doped drain region 246 have substantially equal maximum widths. Further, the raised source and drain regions 240 and 242 and the heavily-doped source and drain regions 244 and 246 each have a conductivity type that is opposite to the conductivity type of substrate region 212.

Lightly-doped source region 230, raised source region 240, and heavily-doped source region 244 form a source 250, while lightly-doped drain region 232, raised drain region 242, and heavily-doped region 246 form a drain 252. The source and drain 250 and 252 define a channel region 254 of substrate region 212 that lies between and separates the source and drain 250 and 252. Further, the implant also forms a MOS transistor structure 260.

Following this, MOS transistor structure 260 is again annealed to drive in the implant. The anneal causes the heavily-doped source and drain regions 244 and 246 to expand slightly into the lightly-doped source and drain regions 230 and 232 due to out diffusion. As a result, the maximum width of heavily-doped source region 244 is slightly larger than the maximum width of raised source region 240.

However, since the only difference in the maximum widths is due to out diffusion, the maximum width of heavily-doped source region 244 is insubstantially larger than the maximum width of raised source region 240. Similarly, the maximum width of heavily-doped drain region 246 is slightly larger than the maximum width of raised drain region 242 due to out diffusion. However, since the only difference in the maximum widths is due to out diffusion, the maximum width of heavily-doped drain region 246 is insubstantially larger than the maximum width of raised drain region 242. Following this, method 200 continues with conventional steps.

FIGS. 3A-3B show cross-sectional views that illustrate an alternate prior-art method 300 of forming a raised source/drain MOS transistor. Method 300 is similar to method 200 and, as a result, utilizes the same reference numerals to designate the structures that are common to both methods.

Method 300 is the same as method 200 up through the formation of sidewall spacer 234 shown in FIG. 2D, and differs from method 200 in that, as shown in FIG. 3A, method 300 next implants a dopant into substrate region 212 and the lightly-doped source and drain regions 230 and 232 to form spaced-apart heavily-doped source and drain regions 310 and 312.

As shown in FIG. 3B, after the heavily-doped source and drain regions 310 and 312 have been formed, a raised source region 320 is epitaxially grown on heavily-doped source region 310, while a raised drain region 322 is epitaxially grown on heavily-doped drain region 312 at the same time.

Lightly-doped source region 230, raised source region 320, and heavily-doped source region 310 form a source 330, while lightly-doped drain region 232, raised drain region 322, and heavily-doped drain region 312 form a drain 332. The source and drain regions 330 and 332 form a channel region 334 in substrate region 212 that lies between and separates the source and drain regions 330 and 332. Further, the implant also forms a MOS transistor structure 340.

Following this, MOS transistor structure 340 is again annealed to drive in the heavily-doped implant. The anneal causes the heavily-doped source and drain regions 310 and 312 to expand slightly into the lightly-doped source and drain regions 230 and 232 due to out diffusion. As a result, the maximum width of heavily-doped source region 310 is slightly, but insubstantially larger, than the maximum width of raised source region 320. Similarly, the maximum width of heavily-doped drain region 312 is slightly, but insubstantially larger, than the maximum width of raised drain region 322. Following this, method 300 continues with conventional steps.

Although method 200 and method 300 illustrate approaches for fabricating a raised source/drain MOS transistor, there is a need for additional approaches to fabricating raised source/drain MOS transistors.

SUMMARY OF THE INVENTION

The present invention provides a raised source/drain MOS transistor and a method of forming the transistor that optimize the positions of the heavily-doped source and drain regions with respect to the positions of the raised source and drain regions. A semiconductor structure of the present invention includes a semiconductor region that has a conductivity type. The semiconductor structure also includes a source that has a conductivity type that is opposite to the conductivity type of the semiconductor region. The source includes a lightly-doped source region that touches the semiconductor region, a heavily-doped source region that touches the lightly-doped source region, and a raised source region that touches the heavily-doped source region. The heavily-doped source region has a width, and the raised source region has a width. The width of the raised source region is greater than the width of the heavily-doped source region. In addition, the semiconductor structure includes a drain that has a conductivity type that is opposite to the conductivity type of the semiconductor region. The drain includes a lightly-doped drain region that touches the semiconductor region, a heavily-doped drain region that touches the lightly-doped drain region, and a raised drain region that touches the heavily-doped drain region. Further, the semiconductor structure includes a channel region of the semiconductor region that lies laterally between the source and the drain. The semiconductor structure additionally includes a gate dielectric that touches and lies over the channel region, and a gate that touches and lies over the gate dielectric.

A semiconductor structure in an alternate embodiment of the present invention includes a semiconductor region that has a conductivity type. The semiconductor structure also includes a source that has a conductivity type that is opposite to the conductivity type of the semiconductor region. The source includes a lightly-doped source region that touches the semiconductor region, a heavily-doped source region that touches the lightly-doped source region, and a raised source region that touches the heavily-doped source region. The heavily-doped source region has a width, and the raised source region has a width. The width of the heavily-doped source region is substantially greater than the width of the raised source region. In addition, the semiconductor structure includes a drain that has a conductivity type that is opposite to the conductivity type of the semiconductor region. The drain includes a lightly-doped drain region that touches the semiconductor region, a heavily-doped drain region that touches the lightly-doped drain region, and a raised drain region that touches the heavily-doped drain region. Further, the semiconductor structure includes a channel region of the semiconductor region that lies laterally between the source and the drain. The semiconductor structure additionally includes a gate dielectric that touches and lies over the channel region, and a gate that touches and lies over the gate dielectric.

A method of forming a semiconductor structure in the present invention includes forming a gate structure that includes a gate dielectric that touches and lies above a semiconductor region, and a gate that touches and lies above the gate dielectric. The method also includes implanting the semiconductor region after the gate structure has been formed to form a lightly-doped source region and a lightly-doped drain region that touch the semiconductor region. The method further includes forming a first sidewall spacer that touches and laterally surrounds the gate structure. In addition, the method includes implanting the semiconductor region, the lightly-doped source region, and the lightly-doped drain region after the first sidewall spacer has been formed to form a heavily-doped source region and a heavily-doped drain region. The heavily-doped source region touches the semiconductor region and the lightly-doped source region. The heavily-doped drain region touches the semiconductor region and the lightly-doped drain region. The method additionally includes forming a second sidewall spacer that touches and laterally surrounds the gate structure after the heavily-doped source region and the heavily-doped drain region have been formed. Further, the method includes epitaxially growing a raised source region that touches the heavily-doped source region, and a raised drain region that touches the heavily-doped drain region after the second sidewall spacer has been formed.

A method of forming a semiconductor structure in an alternate embodiment of the present invention includes forming a gate structure that includes a gate dielectric that touches and lies above a semiconductor region, and a gate that touches and lies above the gate dielectric. The method also includes implanting the semiconductor region after the gate structure has been formed to form a lightly-doped source region and a lightly-doped drain region that touch the semiconductor region. The method additionally includes forming a first sidewall spacer that touches and laterally surrounds the gate structure. The method further includes epitaxially growing a raised source region that touches the lightly-doped source region, and a raised drain region that touches the lightly-doped drain region after the first sidewall spacer has been formed. In addition, the method includes forming a second sidewall spacer that touches and laterally surrounds the gate structure after the raised source region and the raised drain region have been formed. Further, the method includes implanting the semiconductor region, the lightly-doped source region, and the lightly-doped drain region after the second sidewall spacer has been formed to form a heavily-doped source region and a heavily-doped drain region. The heavily-doped source region touches the semiconductor region, the lightly-doped source region, and the raised source region. The heavily-doped drain region touches the semiconductor region, the lightly-doped drain region, and the raised drain region.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 4:
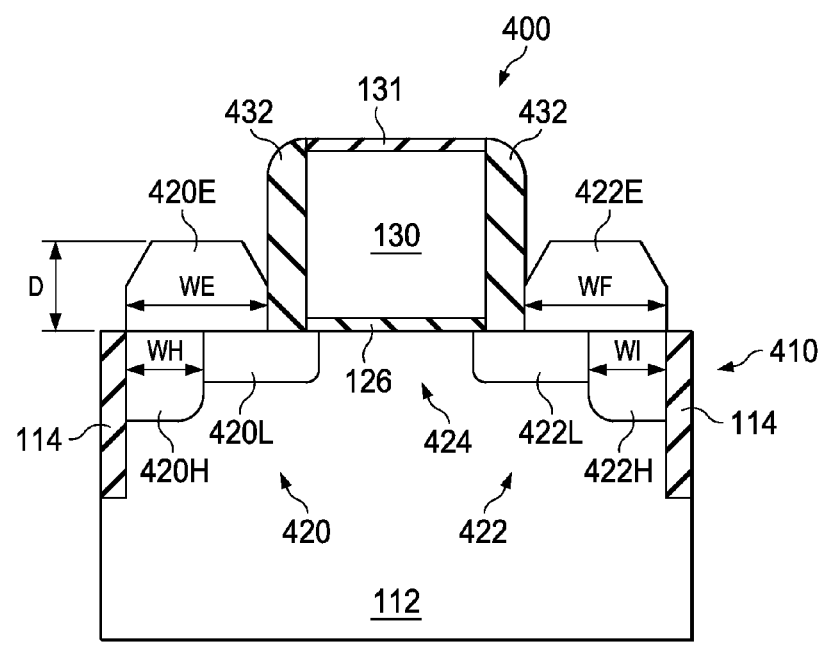
FIG. 4 is a cross-sectional view illustrating an example of a raised source/drain MOS transistor 400 in accordance with the present invention.

FIG. 4 shows a cross-sectional view that illustrates an example of a raised source/drain MOS transistor 400 in accordance with the present invention. As described in greater detail below, the present invention utilizes two different sidewall spacers to independently set the positions of the heavily-doped source and drain regions, and the raised source and drain regions.

MOS transistor 400 is similar to MOS transistor 100 and, as a result, utilizes the same reference numerals to designate the structures which are common to both transistors. As shown in FIG. 4, MOS transistor 400 differs from MOS transistor 100 in that MOS transistor 400 utilizes a body 410 in lieu of body 110. Body 410, in turn, is the same as body 110 except that body 410 utilizes a source 420 in lieu of source 120.

Source 420 includes a lightly-doped source region 420L, a heavily-doped source region 420H, and a raised source region 420E, each of which has a conductivity type that is the opposite of the conductivity type of substrate region 112. Lightly-doped source region 420L touches substrate region 112, and heavily-doped source region 420H touches both substrate region 112 and lightly-doped source region 420L. In addition, raised source region 420E, which is heavily-doped, touches and lies above the top surface of heavily-doped source region 420H.

Further, raised source region 420E has a maximum width WE, a maximum depth D that is orthogonal to the maximum width WE, and a length that is orthogonal to the maximum width WE and the maximum depth D. Heavily-doped source region 420H also has a maximum width WH, a depth measured parallel to the maximum depth D, and a length measured parallel to the length of raised source region 420E.

As additionally shown in FIG. 4, the maximum width WE of raised source region 420E is larger than the maximum width WH of heavily-doped source region 420H. In addition, a portion of raised source region 420E lies directly vertically over a portion of lightly-doped source region 420L.

Body 410 also differs from body 110 in that body 410 utilizes a drain 422 in lieu of drain 122. Drain 422 includes a lightly-doped drain region 422L, a heavily-doped drain region 422H, and a raised drain region 422E, each of which has a conductivity type that is the opposite of the conductivity type of substrate region 112.

Lightly-doped drain region 422L touches substrate region 112, and heavily-doped drain region 422H touches both substrate region 112 and lightly-doped drain region 422L. Raised drain region 422E, which is heavily doped, touches and lies above the top surface of heavily-doped drain region 422H. In addition, the top surface of raised source region 420E and the top surface of the raised drain region 422E lie in a plane that passes through gate 130, where the plane lies above the bottom surface of gate 130.

Further, raised drain region 422E has a maximum width WF, a maximum depth measured parallel to the maximum depth D, and a length measured parallel to the length of raised source region 420E. Heavily-doped drain region 422H also has a maximum width WI, a depth measured parallel to the maximum depth D, and a length measured parallel to the length of raised source region 420E.

As additionally shown in FIG. 4, the maximum width WF of raised drain region 422E is larger than the maximum width WI of heavily-doped drain region 422H. In addition, a portion of raised drain region 420E lies directly vertically over a portion of lightly-doped drain region 422L.

The source 420 and drain 422, which are spaced apart, also define a channel region 424 at the top surface of substrate region 112 that lies between and separates source 420 and drain 422. In addition, since channel region 424 is a part of substrate region 112, channel region 424 has the same conductivity type as substrate region 112.

As further shown in FIG. 4, MOS transistor 400 also differs from MOS transistor 100 in that MOS transistor 400 utilizes a sidewall spacer 432 in lieu of sidewall spacer 132. Sidewall spacer 432, which touches the raised source and drain regions 420E and 422E, is the same as sidewall spacer 132 except that sidewall spacer 432 is thinner than sidewall spacer 132.

FIGS. 5A-5E show cross-sectional views that illustrate an example of a method 500 of forming a raised source/drain MOS transistor in accordance with the present invention. Method 500 is similar to method 200 and, as a result, utilizes the same reference numerals to designate the structures that are common to both methods.

Figure 1:
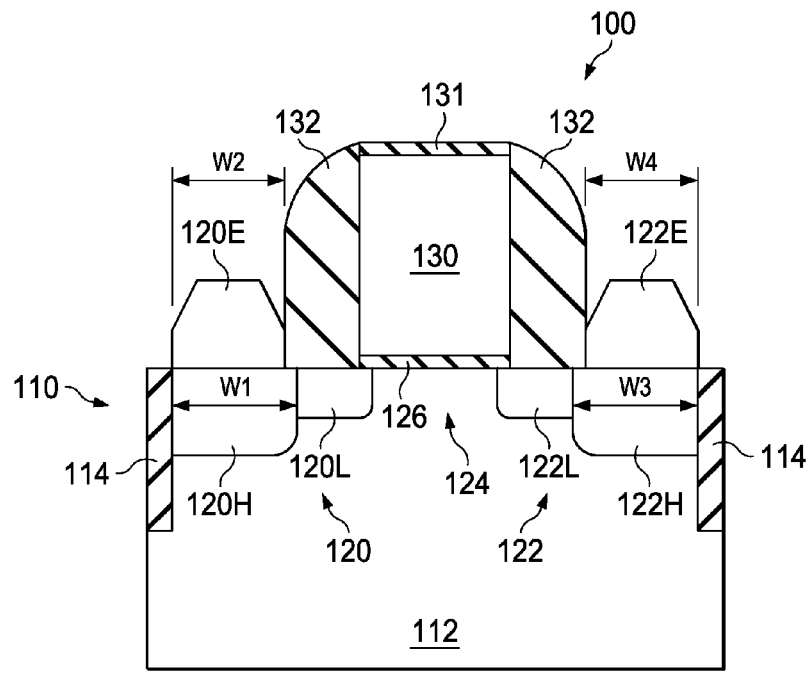
FIG. 1 is a cross-sectional view illustrating a prior-art raised source/drain MOS transistor 100.
Figure 2A:
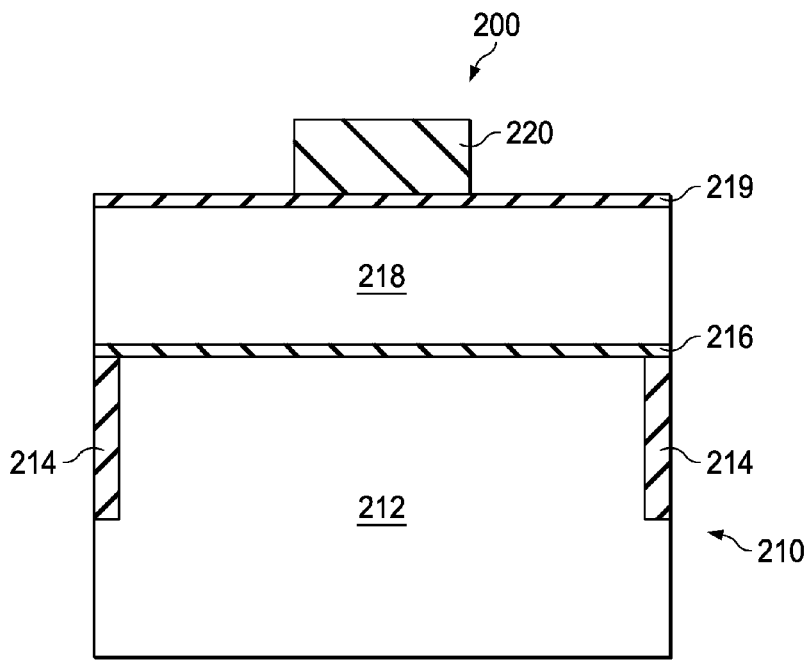
FIGS. 2A-2F are cross-sectional views illustrating a prior-art method 200 of forming a raised source/drain MOS transistor.
Figure 2B:
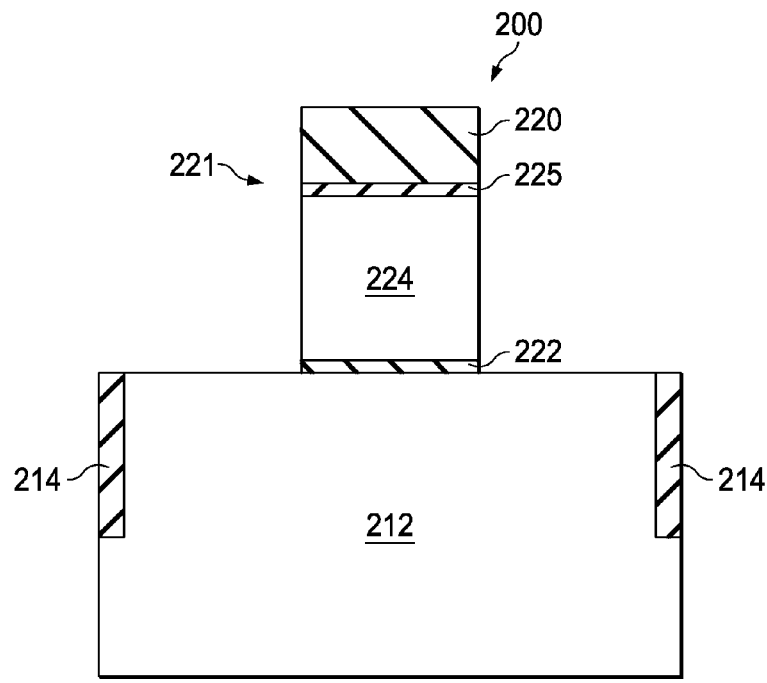
Figure 2C:
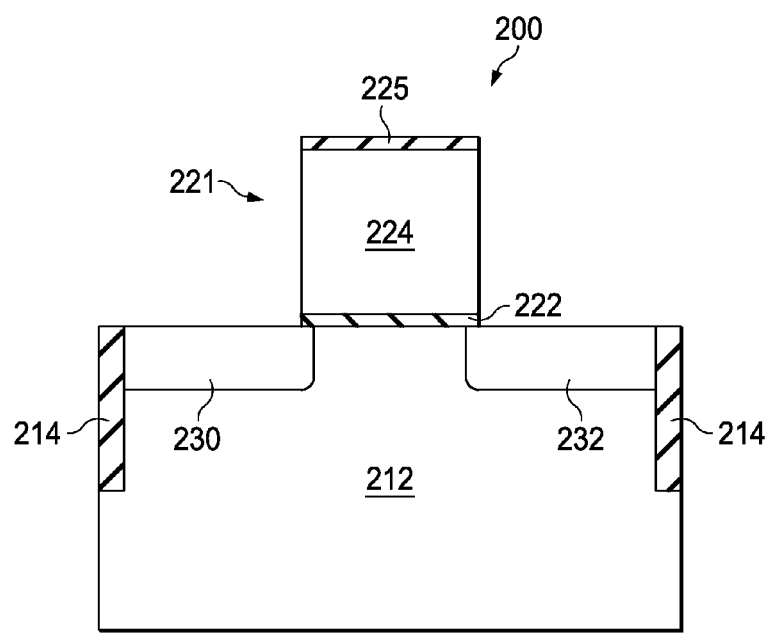
Figure 2D:
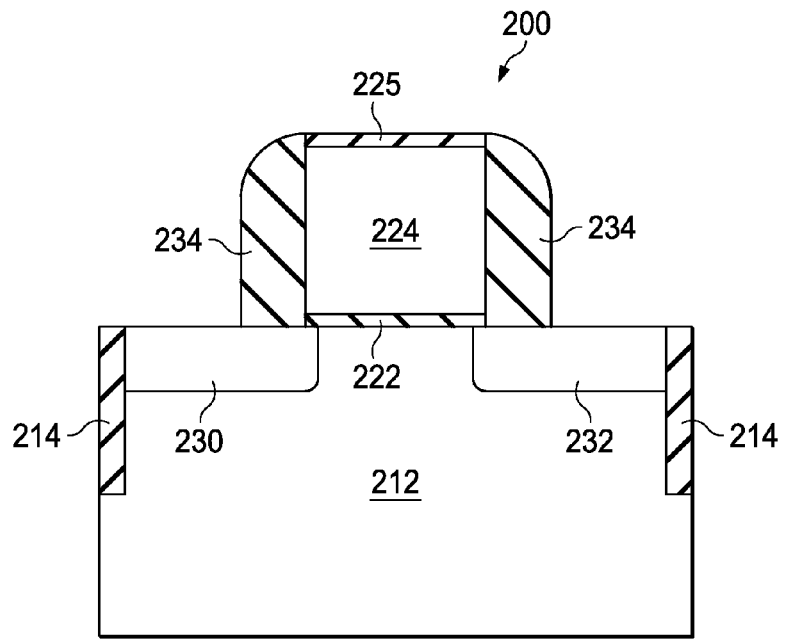
Figure 2E:
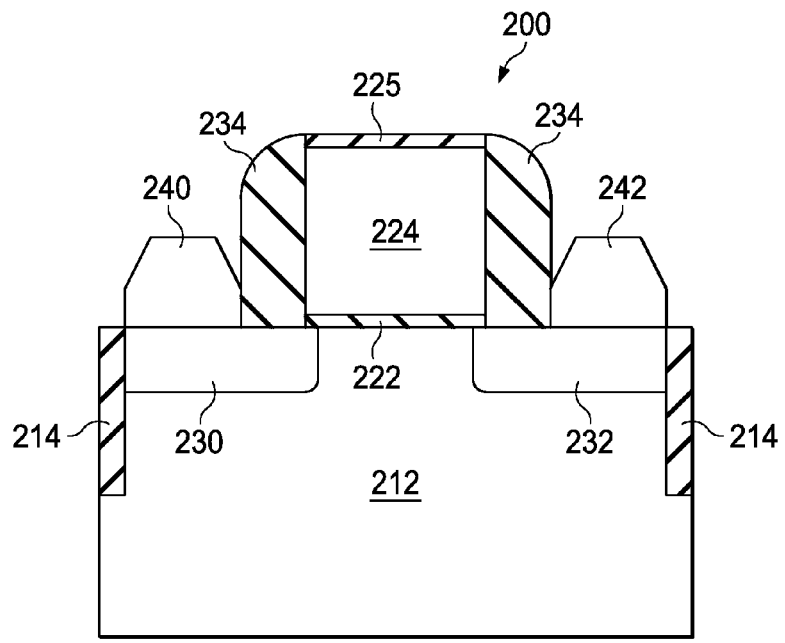
Figure 2F:
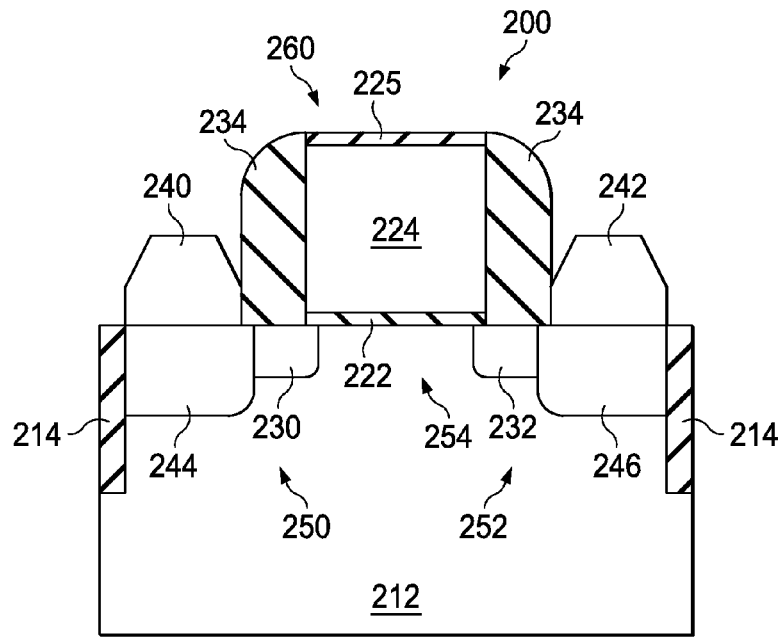
Figure 3A:
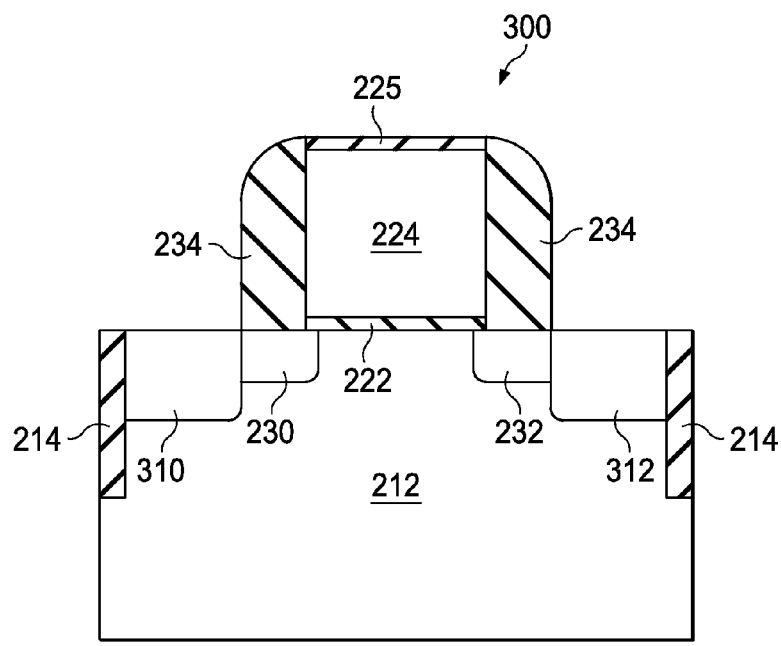
FIGS. 3A-3B are cross-sectional views illustrating an alternate prior-art method 300 of forming a raised source/drain MOS transistor.
Figure 3B:
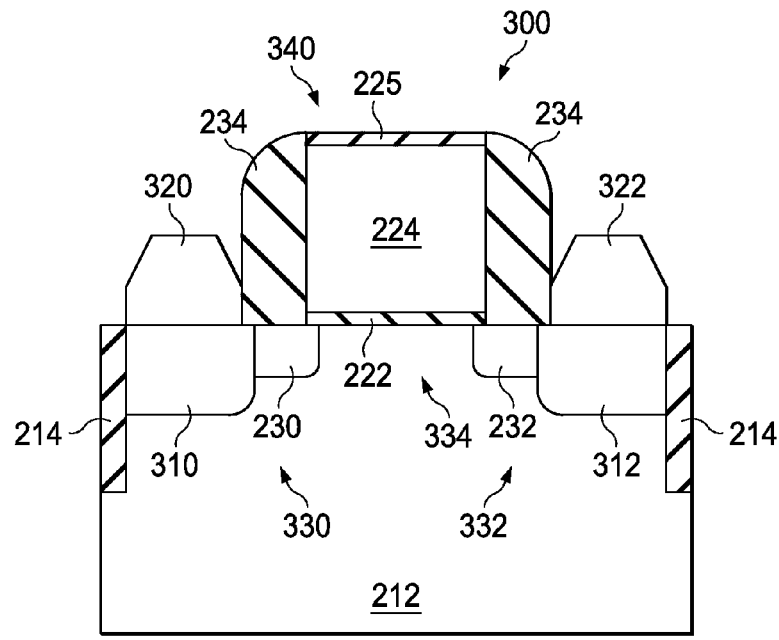
Figure 5A:
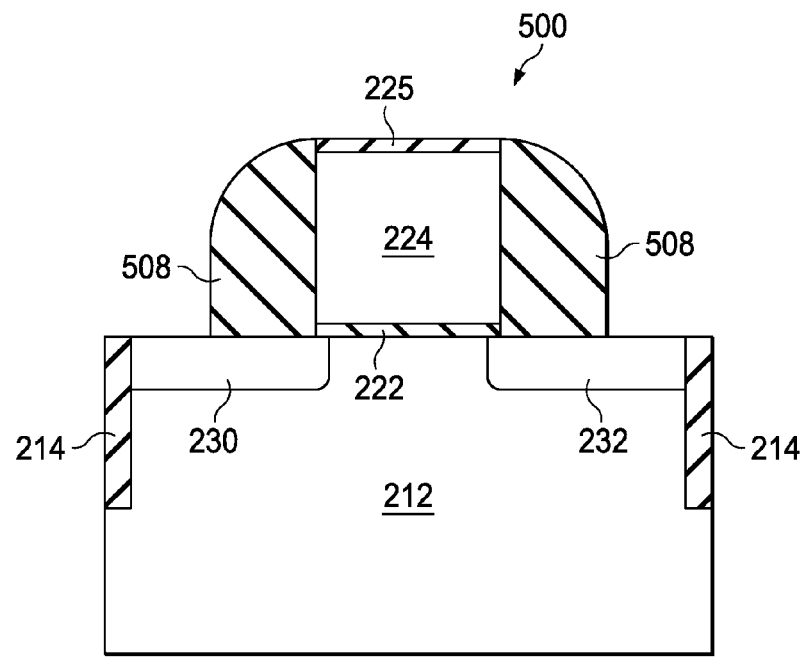
FIGS. 5A-5E are cross-sectional views illustrating an example of a method 500 of forming a raised source/drain MOS transistor in accordance with the present invention.

Method 500 is the same as method 200 up through the formation of the lightly-doped source and drain regions 230 and 232 shown in FIG. 2C, and differs from method 200 in that, as shown in FIG. 5A, method 500 next forms a wide sidewall spacer 508 to touch and laterally surround gate 224 and protective cap 225.

Wide sidewall spacer 508, which is non-conductive, can be formed in a number of ways. For example, a thick layer of oxide can be deposited on gate 224, protective cap 225, lightly-doped source region 230, and lightly-doped drain region 232, followed by the anisotropic etch of the thick layer of oxide until the top surface of protective cap 225 has been exposed to form wide sidewall spacer 508.

Figure 5B:
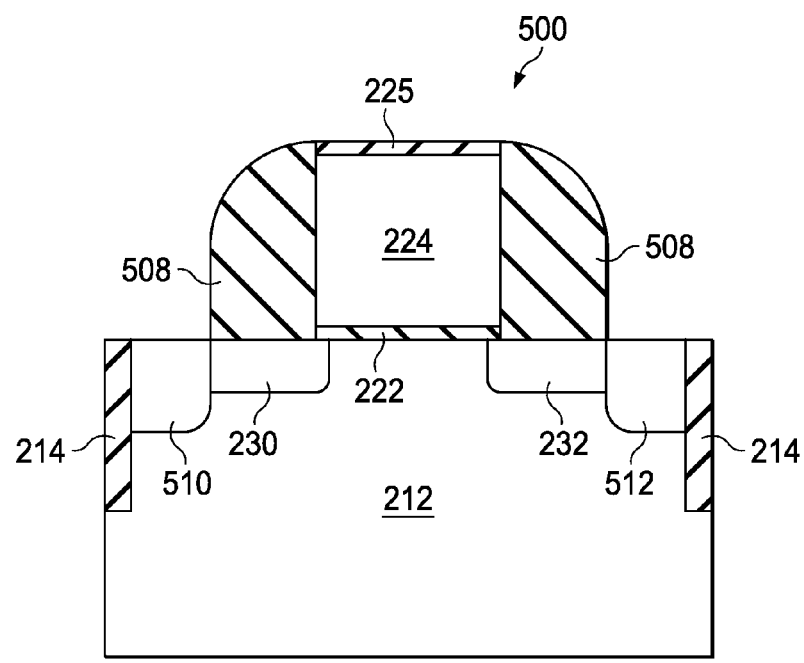

As shown in FIG. 5B, after wide sidewall spacer 508 has been formed, a dopant is implanted into substrate region 212 and the lightly-doped source and drain regions 230 and 232 using conventional procedures to form spaced-apart heavily-doped source and drain regions 510 and 512. Heavily-doped source region 510 touches both substrate region 212 and lightly-doped source region 230, while heavily-doped drain region 512 touches both substrate region 212 and lightly-doped drain region 232.

Figure 5C:
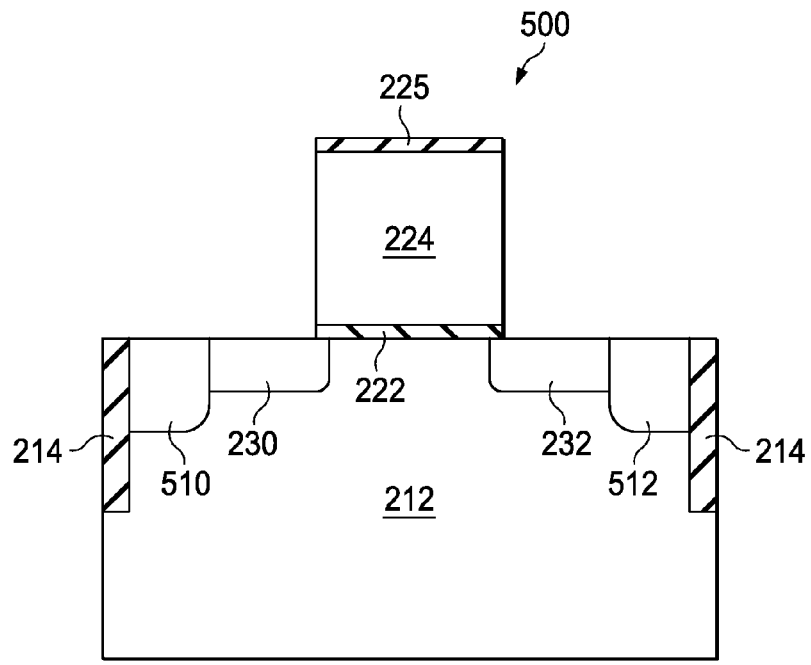
Figure 5D:
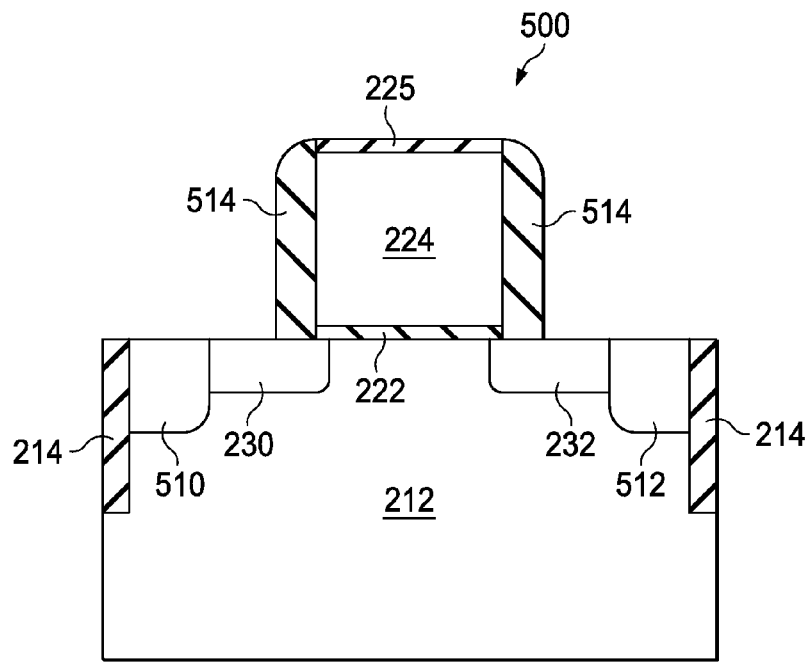

As shown in FIG. 5C, after the heavily-doped regions 510 and 512 have been formed, wide sidewall spacer 508 is removed using conventional etchants and procedures. As shown in FIG. 5D, after wide sidewall spacer 508 has been removed, a thin sidewall spacer 514 is formed to touch and laterally surround gate 224 and protective cap 225.

Thin side wall spacer 514, which is non-conductive, can be formed in a number of ways. For example, a thin layer of oxide can be deposited on gate 224, protective cap 225, lightly-doped and heavily-doped source region 230/510, and lightly-doped and heavily-doped drain region 232/512, followed by the anisotropic etch of the thin layer of oxide until the top surface of protective cap 225 has been exposed to form thin sidewall spacer 514.

Figure 5E:
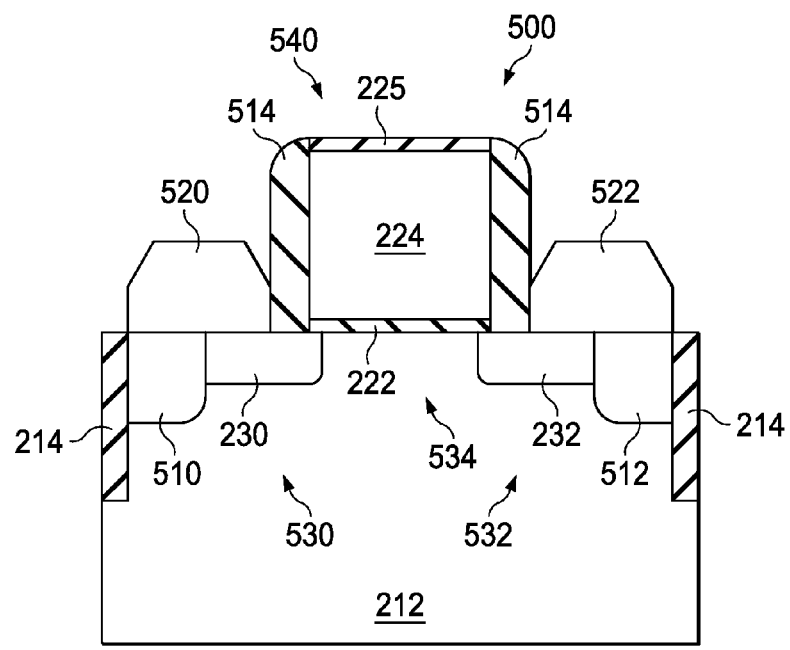

As shown in FIG. 5E, after thin sidewall spacer 514 has been formed, a raised source region 520 is epitaxially grown on heavily-doped source region 510, while a raised drain region 522 is epitaxially grown on heavily-doped drain region 512 at the same time. The raised source region 520 and the raised drain region 522 are grown using conventional procedures.

Lightly-doped source region 230, heavily-doped source region 510, and raised source region 520 form a source 530, while lightly-doped drain region 232, heavily-doped drain region 512, and raised drain region 522 form a drain 532. The source and drain regions 530 and 532 define a channel region 534 of substrate region 212 that lies between and separates the source and drain regions 530 and 532. Further, the implant also forms a MOS transistor structure 540. Following this, MOS transistor structure 540 is annealed, and method 500 continues with conventional steps. The out diffusion from the heavily-doped source and drain regions 510 and 512 heavily dopes the raised source and drain regions 520 and 522, respectively.

One of the advantages of method 500 is that method 500 utilizes a first sidewall spacer 508 to form the heavily-doped source and drain regions 510 and 512, and a second different sidewall spacer 514 to form the raised source region 520 and the raised drain region 522. By using two different sidewall spacers, the widths of the sidewall spacers can be adjusted to optimize the sizes of both the heavily-doped regions and the raised regions.

Figure 6:
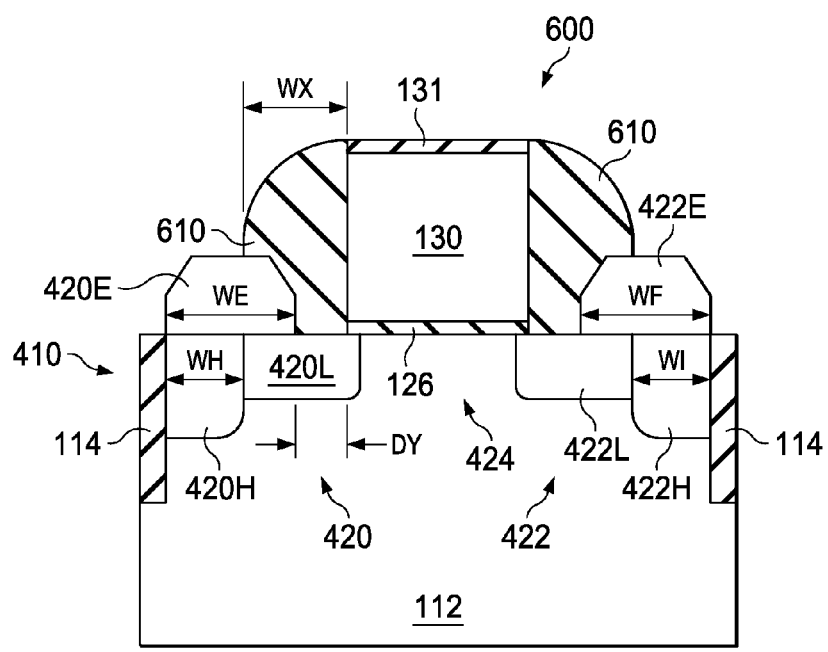
FIG. 6 is a cross-sectional view illustrating an example of a raised source/drain MOS transistor 600 in accordance with an alternate embodiment of the present invention.

FIG. 6 shows a cross-sectional view that illustrates an example of a raised source/drain MOS transistor 600 in accordance with an alternate embodiment of the present invention. MOS transistor 600 is similar to MOS transistor 400 and, as a result, utilizes the same reference numerals to designate the structures which are common to both transistors.

As shown in FIG. 6, MOS transistor 600 differs from MOS transistor 400 in that MOS transistor 600 utilizes a sidewall spacer 610 in lieu of sidewall spacer 432. Sidewall spacer 610 is the same as sidewall spacer 132 and 432, except that sidewall spacer 610 is wider than either sidewall spacer 132 or sidewall spacer 432.

In addition, sidewall spacer 610 also touches and lies over the top surface of raised source region 520 and the top surface raised drain region 522, whereas sidewall spacer 132 does not touch and lie over the top surface of the raised source region 120E and the top surface of raised drain region 122E. Further, the maximum width WX of sidewall spacer 610 is substantially greater than a minimum distance DY that separates raised source region 420E from gate 130.

FIGS. 7A-7D show cross-sectional views that illustrate an example of a method 700 of forming a raised source/drain MOS transistor in accordance with an alternate embodiment of the present invention. Method 700 is similar to method 200 and, as a result, utilizes the same reference numerals to designate the structures that are common to both methods.

Figure 7A:
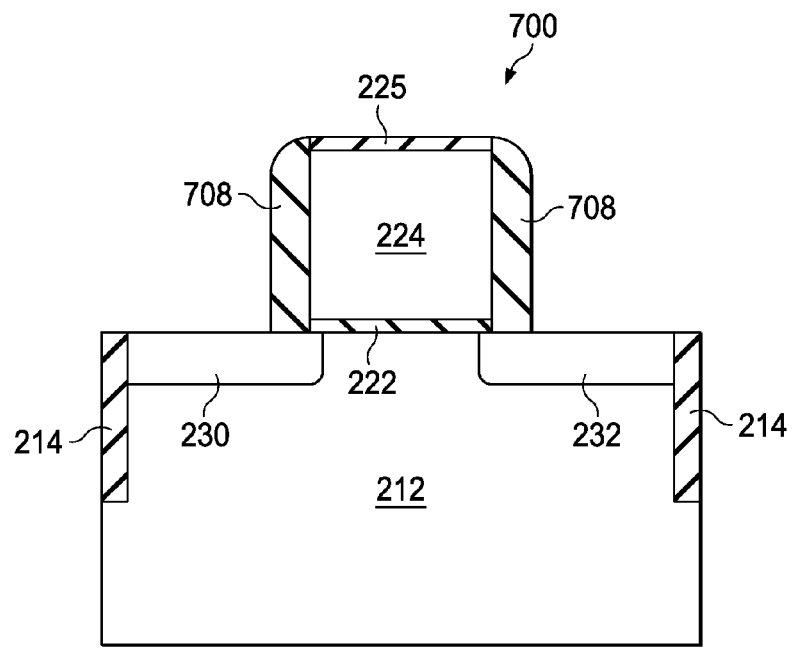
FIGS. 7A-7D are cross-sectional views illustrating an example of a method 700 of forming a raised source/drain MOS transistor in accordance with an alternate embodiment of the present invention.

Method 700 is the same as method 200 up through the formation of the lightly-doped source and drain regions 230 and 232 shown in FIG. 2C, and differs from method 200 in that, as shown in FIG. 7A, method 700 next forms a thin sidewall spacer 708 to touch and laterally surround gate 224 and protective cap 225.

Thin side wall spacer 708, which is non-conductive, can be formed in a number of ways. For example, a thin layer of oxide can be deposited on gate 224, protective cap 225, lightly-doped source region 230, and lightly-doped drain region 232, followed by the anisotropic etch of the thin layer of oxide until the top surface of protective cap 225 has been exposed to form thin sidewall spacer 708.

Figure 7B:
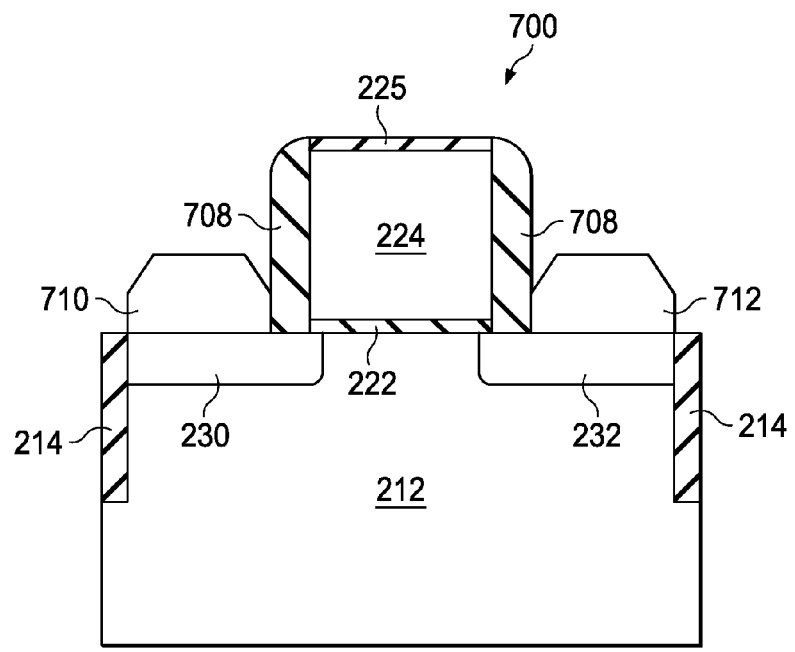

As shown in FIG. 7B, after thin sidewall spacer 708 has been formed, a raised source region 710 is epitaxially grown on lightly-doped source region 230, while a raised drain region 712 is epitaxially grown on lightly-doped drain region 232 at the same time. The raised source region 710 and the raised drain region 712 are grown using conventional procedures.

Figure 7C:
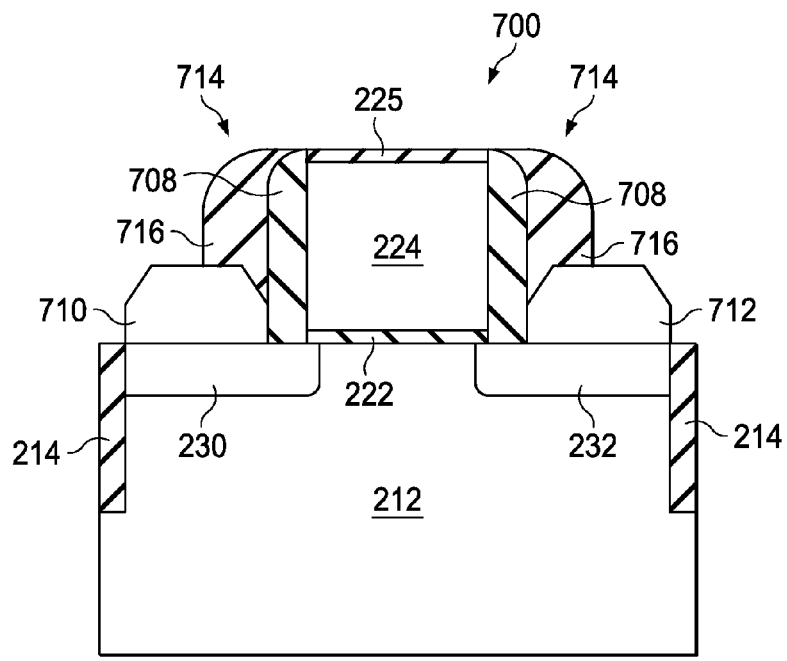

As shown in FIG. 7C, after the raised source and drain regions 710 and 712 have been formed, a wide sidewall spacer 714 is formed to touch and laterally surround gate 224 and protective cap 225. Wide side wall spacer 714, which is non-conductive, can be formed in a number of ways.

For example, a layer of oxide can be deposited on protective cap 225, sidewall spacer 708, raised source region 710, and raised drain region 712, followed by an anisotropic etch of the layer of oxide until the top surface of protective cap 225 has been exposed to form a sidewall spacer 716. In this example, sidewall spacer 708 and sidewall spacer 716 in combination form wide sidewall spacer 714.

Alternately, wide sidewall spacer 714 can be formed by first removing sidewall spacer 708. After this, wide sidewall spacer 714 is formed by depositing a thick layer of oxide, followed by an anisotropic etch of the thick layer of oxide until the top surface of protective cap 225 has been exposed to form a sidewall spacer 716.

Figure 7D:
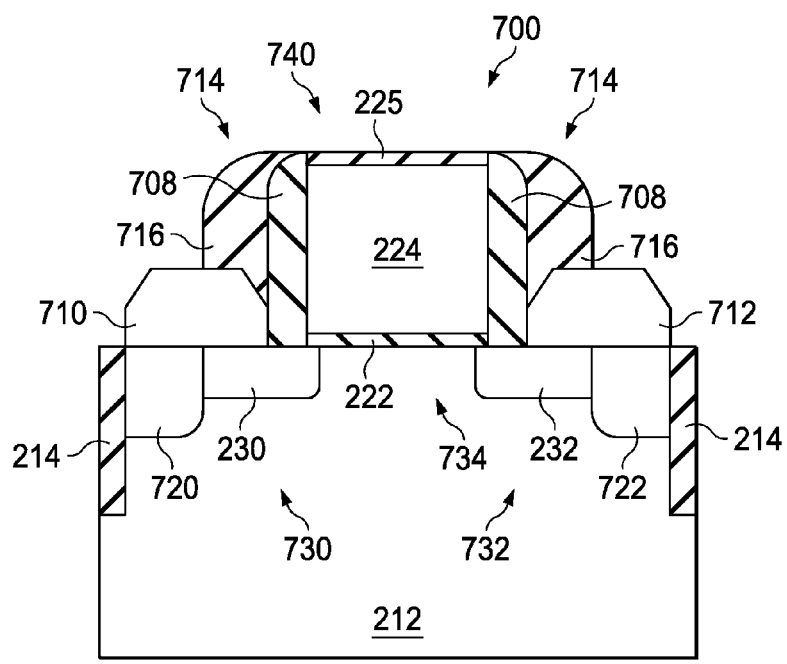

As shown in FIG. 7D, after wide sidewall spacer 714 has been formed, a dopant is implanted into substrate region 212 and the lightly-doped source and drain regions 230 and 232 using conventional procedures to form spaced-apart heavily-doped source and drain regions 720 and 722. Heavily-doped source region 720 touches both substrate region 212 and lightly-doped source region 230, while heavily-doped drain region 722 touches both substrate region 212 and lightly-doped drain region 232.

Lightly-doped source region 230, heavily-doped source region 720, and raised source region 710 form a source 730, while lightly-doped drain region 232, heavily-doped drain region 722, and raised drain region 712 form a drain 732. The source and drain regions 730 and 732 define a channel region 734 of substrate region 212 that lies between and separates the source and drain 730 and 732. Further, the implant also forms a MOS transistor structure 740. Following this, MOS transistor structure 740 is annealed, and method 700 continues with conventional steps.

Figure 8:
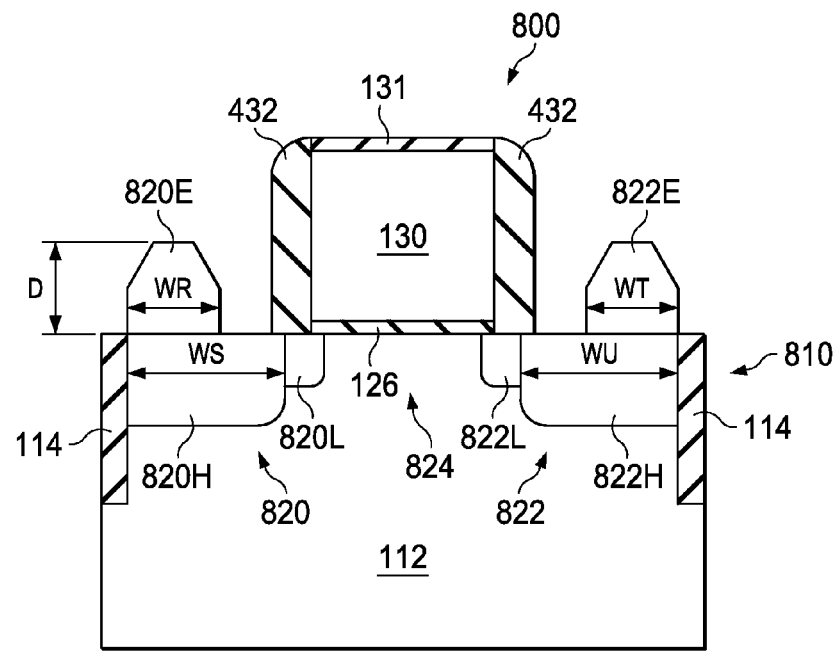
FIG. 8 is a cross-sectional view illustrating an example of a raised source/drain MOS transistor 800 in accordance with an alternate embodiment of the present invention.

FIG. 8 shows a cross-sectional view that illustrates an example of a raised source/drain MOS transistor 800 in accordance with an alternate embodiment of the present invention. MOS transistor 800 is similar to MOS transistor 400 and, as a result, utilizes the same reference numerals to designate the structures which are common to both transistors.

As shown in FIG. 8, MOS transistor 800 differs from MOS transistor 400 in that MOS transistor 800 utilizes a body 810 in lieu of body 410. Body 810, in turn, is the same as body 410 except that body 810 utilizes a source 820 in lieu of source 420. Source 820 includes a lightly-doped source region 820L, a heavily-doped source region 820H, and a raised source region 820E, each of which has a conductivity type that is the opposite of the conductivity type of substrate region 112.

Lightly-doped source region 820L touches substrate region 112, and heavily-doped source region 820H touches both substrate region 112 and lightly-doped source region 820L. In addition, raised source region 820E, which is heavily-doped, touches and lies above the top surface of heavily-doped source region 820H. All of raised source region 820E also lies laterally spaced apart from sidewall spacer 432.

Further, raised source region 820E is spaced apart from a portion of the top surface of heavily-doped source region 820H. Raised source region 820E also has a maximum width WR, a maximum depth D that is orthogonal to the maximum width WR, and a length that is orthogonal to the maximum width WR and the maximum depth D.

Heavily-doped source region 820H also has a maximum width WS, a depth measured parallel to the maximum depth D, and a length measured parallel to the length of raised source region 820E. As additionally shown in FIG. 8, the maximum width WS of heavily-doped source region 820H is substantially larger than the maximum width WR of raised source region 820E.

Body 810 also differs from body 410 in that body 810 utilizes a drain 822 in lieu of drain 422. Drain 822 includes a lightly-doped drain region 822L, a heavily-doped drain region 822H, and a raised drain region 822E, each of which has a conductivity type that is the opposite of the conductivity type of substrate region 112.

Lightly-doped drain region 822L touches substrate region 112, and heavily-doped drain region 822H touches both substrate region 112 and lightly-doped drain region 822L. Raised drain region 822E, which is heavily doped, touches and lies above the top surface of heavily-doped drain region 822H. All of raised drain region 822E also lies laterally spaced apart from sidewall spacer 432. In addition, the top surface of raised source region 820E and the top surface of the raised drain region 822E lie in a plane that passes through gate 130, where the plane lies above the bottom surface of gate 130.

Further, raised drain region 822E is spaced apart from a portion of the top surface of heavily-doped drain region 822H. Raised drain region 822E also has a maximum width WT, a maximum depth measured parallel to the maximum depth D, and a length that is measured parallel to the length of the raised drain region 822E.

As additionally shown in FIG. 8, the maximum width WU of heavily-doped source region 822H is substantially larger than the maximum width WT of raised source region 820E. In addition, a portion of the top surface of heavily-doped drain region 822H is spaced apart from raised drain region 822E.

The source 820 and drain 822, which are spaced apart, also define a channel region 824 at the top surface of substrate region 112 that lies between and separates source 820 and drain 822. In addition, since channel region 824 is a part of substrate region 112, channel region 824 has the same conductivity type as substrate region 112.

Figure 9A:
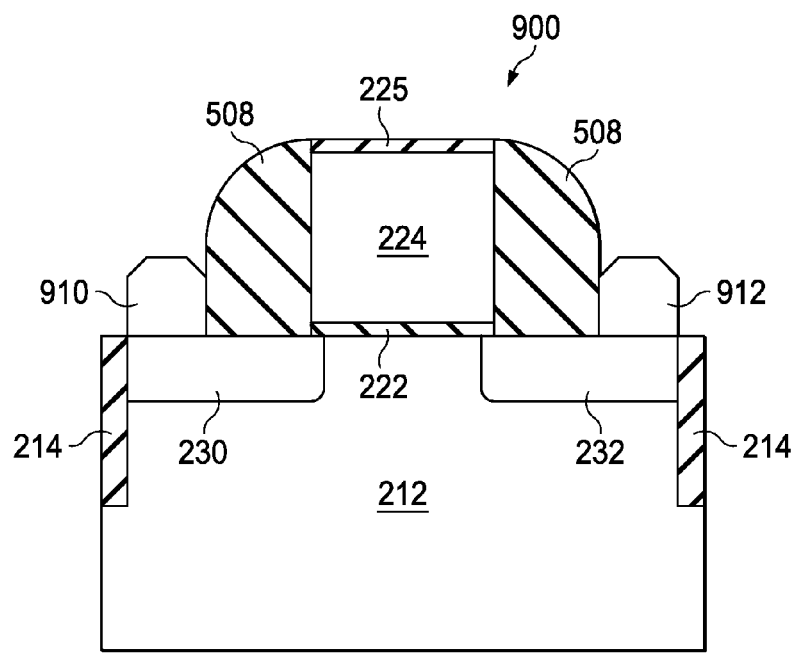
FIGS. 9A-9C are cross-sectional views illustrating an example of a method 900 of forming a raised source/drain MOS transistor in accordance with an alternate embodiment of the present invention.
Figure 9B:
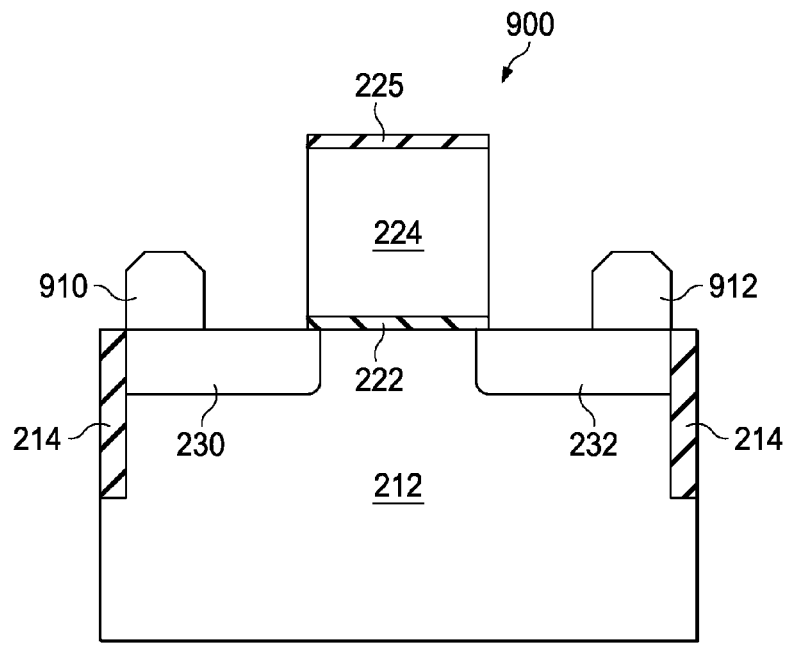
Figure 9C:
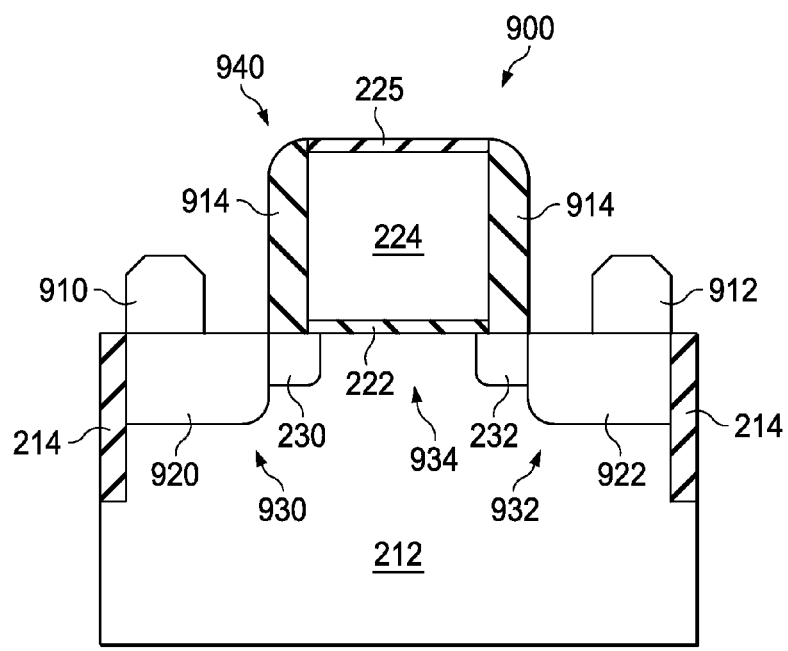

FIGS. 9A-9C show cross-sectional views that illustrate an example of a method 900 of forming a raised source/drain MOS transistor in accordance with an alternate embodiment of the present invention. Method 900 is similar to method 500 and, as a result, utilizes the same reference numerals to designate the structures that are common to both methods.

Method 900 is the same as method 500 up through the formation of wide sidewall spacer 508 shown in FIG. 5A, and differs from method 500 in that, as shown in FIG. 9A, method 900 next epitaxially grows a raised source region 910 on lightly-doped source region 230, while epitaxially growing a raised drain region 912 on lightly-doped drain region 232 at the same time. The raised source region 910 and the raised drain region 912 are grown using conventional procedures.

As shown in FIG. 9B, after the raised source and drain regions 910 and 912 have been formed, wide sidewall spacer 508 is removed using conventional etchants and procedures. As shown in FIG. 9C, after wide sidewall spacer 508 has been removed, a thin sidewall spacer 914 is formed to touch and laterally surround gate 224 and protective cap 225. Thin side wall spacer 914, which is non-conductive, is horizontally spaced apart from all of raised source region 910 and all of raised drain region 912.

Thin side wall spacer 914 can be formed in a number of ways. For example, a thin layer of oxide can be deposited on gate 224, protective cap 225, lightly-doped source region 230, lightly-doped drain region 232, raised source region 910, and raised drain region 912, followed by the anisotropic etch of the thin layer of oxide until the top surface of protective cap 225 has been exposed to form thin sidewall spacer 914.

After thin sidewall spacer 914 has been formed, a dopant is implanted into substrate region 212 and the lightly-doped source and drain regions 230 and 232 using conventional procedures to form spaced-apart heavily-doped source and drain regions 920 and 922. Heavily-doped source region 920 touches both substrate region 212 and lightly-doped source region 230, while heavily-doped drain region 922 touches both substrate region 212 and lightly-doped drain region 232. The implant also heavily dopes raised source region 910 and raised drain region 912.

Lightly-doped source region 230, heavily-doped source region 920, and raised source region 910 form a source 930, while lightly-doped drain region 232, heavily-doped drain region 922, and raised drain region 912 form a drain 932. The source and drain regions 930 and 932 define a channel region 934 of substrate region 212 that lies between and separates the source and drain 930 and 932. Further, the implant also forms a MOS transistor structure 940.

Following this, MOS transistor structure 940 is annealed to drive in the implant. The anneal causes the heavily-doped source and drain regions 920 and 922 to expand slightly into the lightly-doped source and drain regions 230 and 232 due to out diffusion. However, the difference in the maximum widths between raised source region 910 and heavily-doped source region 920, although partly due to out diffusion, is primarily due to the different widths of the sidewall spacers 508 and 914. As a result, the maximum width of heavily-doped source region 920 is substantially larger than the maximum width of raised source region 910.

Similarly, the difference in the maximum widths between raised drain region 912 and heavily-doped drain region 922, although partly due to out diffusion, is primarily due to the different widths of the sidewall spacers 508 and 914. As a result, the maximum width of heavily-doped drain region 922 is substantially larger than the maximum width of raised drain region 912. Following this, method 900 continues with conventional steps.

Figure 10:
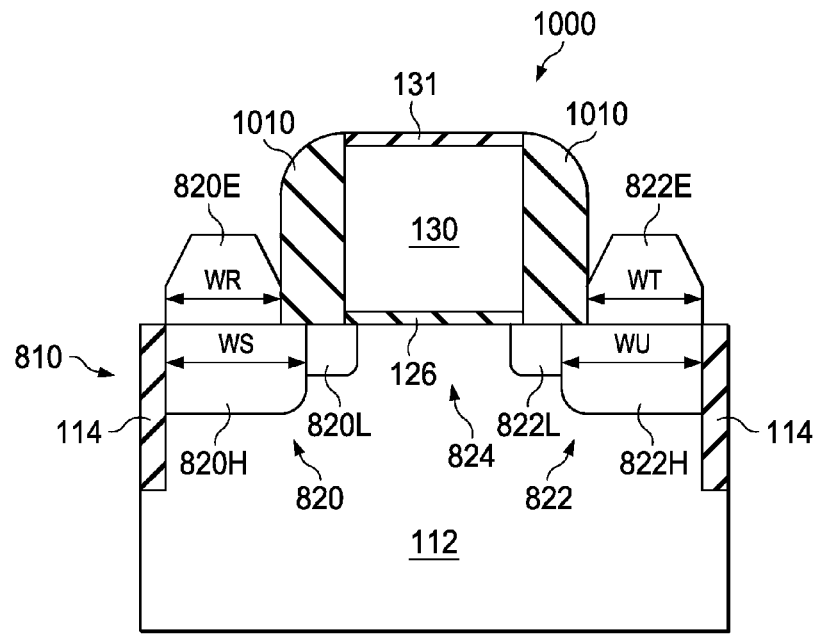
FIG. 10 is a cross-sectional view illustrating an example of a raised source/drain MOS transistor 1000 in accordance with an alternate embodiment of the present invention.

FIG. 10 shows a cross-sectional view that illustrates an example of a raised source/drain MOS transistor 1000 in accordance with an alternate embodiment of the present invention. MOS transistor 1000 is similar to MOS transistor 800 and, as a result, utilizes the same reference numerals to designate the structures which are common to both transistors.

As shown in FIG. 10, MOS transistor 1000 differs from MOS transistor 800 in that MOS transistor 1000 utilizes a sidewall spacer 1010 in lieu of sidewall spacer 432. Sidewall spacer 1010 is the same as sidewall spacer 432, except that sidewall spacer 1010 is wider than sidewall spacer 432. In addition, sidewall spacer 1010 also touches raised source region 820E and raised drain region 822E, whereas sidewall spacer 432 does not touch raised source region 820E and raised drain region 822E.

Figure 11A:
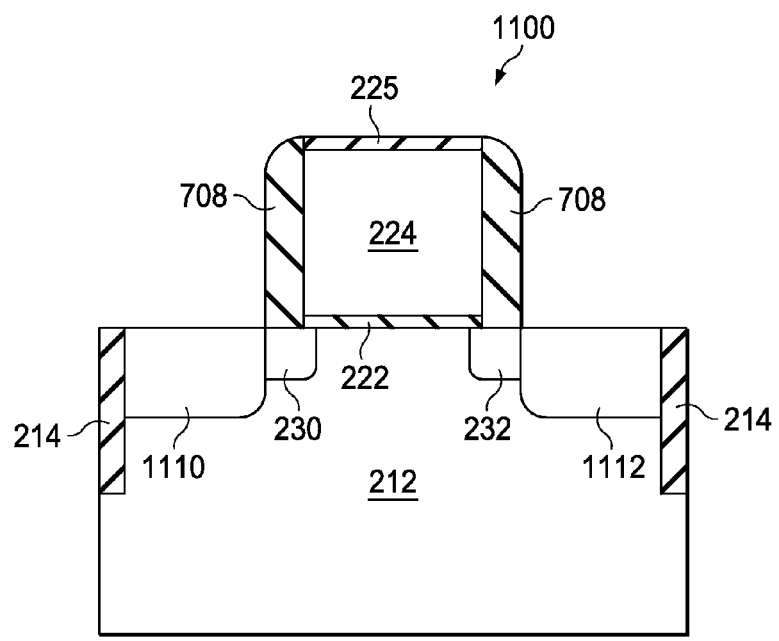
FIGS. 11A-11C are cross-sectional views illustrating an example of a method 1100 of forming a raised source/drain MOS transistor in accordance with an alternate embodiment of the present invention.
Figure 11B:
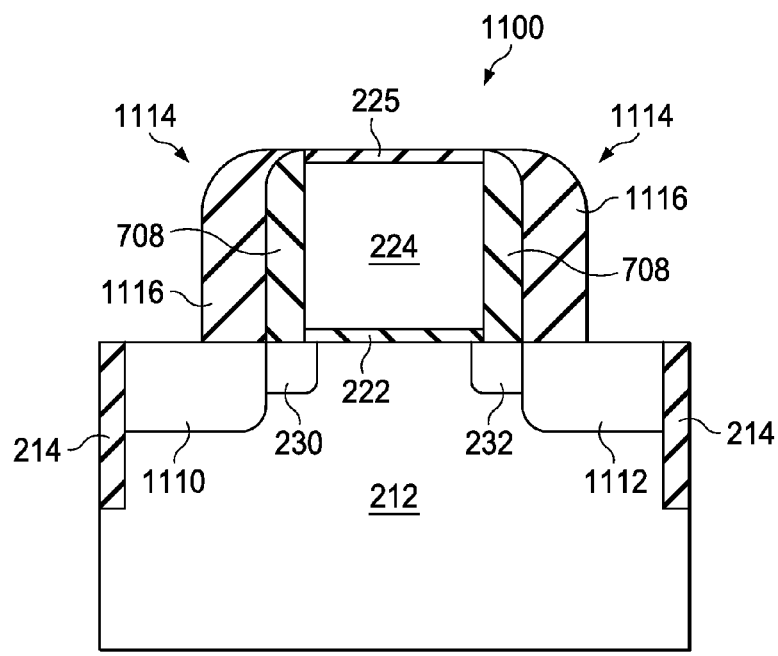
Figure 11C:
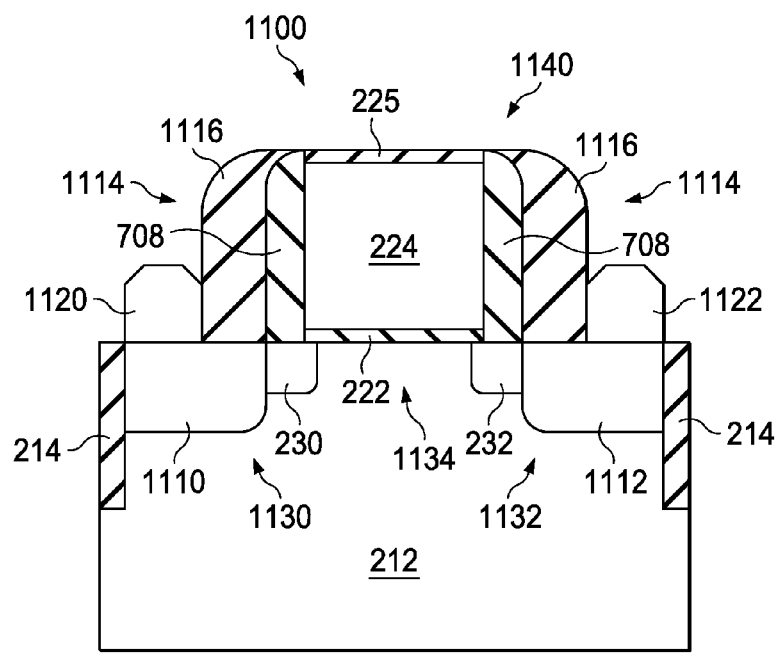

FIGS. 11A-11C show cross-sectional views that illustrate an example of a method 1100 of forming a raised source/drain MOS transistor in accordance with an alternate embodiment of the present invention. Method 1100 is similar to method 700 and, as a result, utilizes the same reference numerals to designate the structures that are common to both methods.

Method 1100 is the same as method 700 up through the formation of thin sidewall spacer 708 shown in FIG. 7A, and differs from method 700 in that, as shown in FIG. 11A, method 1100 next implants a dopant into substrate region 212 and the lightly-doped source and drain regions 230 and 232 using conventional procedures to form spaced-apart heavily-doped source and drain regions 1110 and 1112. Heavily-doped source region 1110 touches both substrate region 212 and lightly-doped source region 230, while heavily-doped drain region 1112 touches both substrate region 212 and lightly-doped drain region 1112.

As shown in FIG. 11B, after the heavily-doped source and drain regions 1110 and 1112 have been formed, a wide sidewall spacer 1114 is formed to touch and laterally surround gate 224 and protective cap 225. Wide side wall spacer 1114, which is non-conductive, can be formed in a number of ways.

For example, a layer of oxide can be deposited on protective cap 225, sidewall spacer 708, raised source region 1120, and raised drain region 1122, followed by an anisotropic etch of the layer of oxide until the top surface of protective cap 225 has been exposed to form a sidewall spacer 1116. In this example, sidewall spacer 708 and sidewall spacer 1116 in combination form wide sidewall spacer 1114.

Alternately, wide sidewall spacer 1114 can be formed by first removing sidewall spacer 708. After this, wide sidewall spacer 1114 is formed by depositing a thick layer of oxide, followed by an anisotropic etch of the thick layer of oxide until the top surface of protective cap 225 has been exposed to form a sidewall spacer 1116.

As shown in FIG. 11C, after wide sidewall spacer 1114 has been formed, a raised source region 1120 is epitaxially grown on heavily-doped source region 1110, while a raised drain region 1122 is epitaxially grown on heavily-doped drain region 1112 at the same time. The raised source region 1120 and the raised drain region 1122 are grown using conventional procedures.

Lightly-doped source region 230, heavily-doped source region 1110, and raised source region 1120 form a source 1130, while lightly-doped drain region 232, heavily-doped drain region 1112, and raised drain region 1122 form a drain 1132. The source and drain regions 1130 and 1132 define a channel region 1134 of substrate region 212 that lies between and separates the source and drain 1130 and 1132. Further, the implant also forms a MOS transistor structure 1140.

Following this, MOS transistor structure 1140 is annealed to drive in the implant. The anneal causes the heavily-doped source and drain regions 1110 and 1112 to expand slightly into the lightly-doped source and drain regions 230 and 232 due to out diffusion. However, the difference in the maximum widths between raised source region 1120 and heavily-doped source region 1110, although partly due to out diffusion, is primarily due to the different widths of the sidewall spacers 708 and 1114. As a result, the maximum width of heavily-doped source region 1110 is substantially larger than the maximum width of raised source region 1120.

Similarly, the difference in the maximum widths between raised drain region 1122 and heavily-doped drain region 1112, although partly due to out diffusion, is primarily due to the different widths of the sidewall spacers 708 and 1114. As a result, the maximum width of heavily-doped drain region 1112 is substantially larger than the maximum width of raised drain region 1122. The out diffusion from the heavily-doped source and drain regions 1110 and 1112 also heavily dopes the raised source and drain regions 1120 and 1122, respectively. Following this, method 1100 continues with conventional steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:
    forming a gate structure that includes a gate dielectric that touches and lies above a semiconductor region, and a gate that touches and lies above the gate dielectric;
    implanting the semiconductor region after the gate structure has been formed to form a lightly-doped source region and a lightly-doped drain region that touch the semiconductor region;
    forming a first sidewall spacer that touches and laterally surrounds the gate structure;
    implanting the semiconductor region, the lightly-doped source region, and the lightly-doped drain region after the first sidewall spacer has been formed to form a heavily-doped source region and a heavily-doped drain region, the heavily-doped source region touching the semiconductor region and the lightly-doped source region, the heavily-doped drain region touching the semiconductor region and the lightly-doped drain region;
    forming a second sidewall spacer that touches and laterally surrounds the gate structure after the heavily-doped source region and the heavily-doped drain region have been formed;
    epitaxially growing a raised source region that touches the heavily-doped source region, and a raised drain region that touches the heavily-doped drain region after the second sidewall spacer has been formed; and
    removing the first sidewall spacer after the heavily-doped source region and the heavily-doped drain region have been formed and before the second sidewall spacer is formed.

2. The method of claim 1 wherein the heavily-doped source region has a width, the raised source region has a width, and the width of the raised source region is greater than the width of the heavily-doped source region.

3. A method of forming a semiconductor structure comprising:
    forming a gate structure that includes a gate dielectric that touches and lies above a semiconductor region, and a gate that touches and lies above the gate dielectric;
    implanting the semiconductor region after the gate structure has been formed to form a lightly-doped source region and a lightly-doped drain region that touch the semiconductor region;
    forming a first sidewall spacer that touches and laterally surrounds the gate structure;

implanting the semiconductor region, the lightly-doped source region, and the lightly-doped drain region after the first sidewall spacer has been formed to form a heavily-doped source region and a heavily-doped drain region, the heavily-doped source region touching the semiconductor region and the lightly-doped source region, the heavily-doped drain region touching the semiconductor region and the lightly-doped drain region;

forming a second sidewall spacer that touches and laterally surrounds the gate structure after the heavily-doped source region and the heavily-doped drain region have been formed; and epitaxially growing a raised source region that touches the heavily-doped source region, and a raised drain region that touches the heavily-doped drain region after the second sidewall spacer has been formed;

wherein forming the second sidewall spacer includes forming a third sidewall spacer to touch and laterally surround the first sidewall spacer, a combination of the first sidewall spacer and the third sidewall spacer forming the second sidewall spacer, and wherein the heavily-doped source region has a width, the raised source region has a width, and the width of the heavily-doped source region is substantially greater than the width of the raised source region.

* * * * *